United States Patent
Westrom et al.

[11] Patent Number: 5,600,248
[45] Date of Patent: Feb. 4, 1997

[54] FAULT DISTANCE LOCATOR FOR UNDERGROUND CABLE CIRCUITS

[75] Inventors: Arthur C. Westrom, Stone Mountain; James W. Larsen, Suwanee, both of Ga.

[73] Assignee: Dipl.-Ing H. Horstmann GmbH, Germany

[21] Appl. No.: 493,340

[22] Filed: Jun. 21, 1995

[51] Int. Cl.[6] ............................................. G01R 27/26
[52] U.S. Cl. ......................... 324/522; 324/533; 324/534
[58] Field of Search .................................. 324/520, 522, 324/523, 544, 543, 539, 541, 536; 361/80, 81

[56] References Cited

U.S. PATENT DOCUMENTS

| | | | |
|---|---|---|---|
| 4,313,169 | 1/1982 | Takagi et al. | 324/522 |
| 4,362,986 | 12/1982 | Bunke et al. | 324/522 |
| 4,859,951 | 8/1989 | Cole et al. | 324/534 |
| 4,972,290 | 11/1990 | Sun et al. | 361/66 |
| 5,047,724 | 9/1991 | Boksiner et al. | 324/520 |
| 5,189,374 | 2/1993 | Burnett | 324/534 |
| 5,270,661 | 12/1993 | Burnett | 324/532 |
| 5,479,610 | 12/1995 | Roll-Mecak et al. | 324/534 |
| 5,481,195 | 1/1996 | Meyer | 324/534 |
| 5,483,169 | 1/1996 | Despain et al. | 324/533 |

*Primary Examiner*—Maura K. Regan
*Attorney, Agent, or Firm*—Davis Chin

[57] ABSTRACT

A fault distance locator for underground cable circuits for calculating more accurately the location of a cable fault includes a pulse generator unit for injecting a series of chirped pulse streams into the faulted cable shortly after the cable fault has been established. The delay times between the reflected pulse signals and the sending pulse signals are obtained by a correlation process which is specially designed to eliminate the effect of noise caused by arcing voltage and thus provide an accurate calculation of the distance to the cable fault. The accuracy is further enhanced by injecting pre-fault pulse signals periodically into the cable prior to the occurrence of the cable fault in order to obtain a reference pulse signal. This pulse signal provides information concerning the speed of propagation of the cable and thus affects the distance calculation to the fault.

20 Claims, 7 Drawing Sheets

60 Hz CURRENT

FIG. 2(d)

60 Hz VOLTAGE

FIG. 2(e)

PULSE VOLTAGE

SINGLE H.F. PULSE

FIG. 2(f)

PULSE TRAIN

FAULT DISTANCE LOCATOR FOR UNDERGROUND CABLE CIRCUITS

BACKGROUND OF THE INVENTION

1. Field of the Invention

This invention relates generally to fault-location systems for determining the distance to a fault point and more particularly, it relates to a fault distance locator for underground cable circuits and a method for the same for calculating more accurately the location of a cable fault from a source-connected monitoring location in an efficient and effective manner.

2. Description of the Prior Art

As is generally known to those in the electric utility industry, buried underground cables utilized in the United States are typically formed with a center conductor surrounded by an outer polymeric insulation and a concentric neutral disposed over the polymeric insulation. These underground cables are employed to serve for the distribution or transmission of electrical voltage in the medium range between 15 KV and 35 KV. Faults sometimes develop, such as when the cable is punctured creating a short circuit between the conductor and the concentric neutral, which require the repair or replacement of the cable or a portion thereof. In order to facilitate the correction of the fault, it is desirable to know the exact location of the fault.

To this end, electric utilities have constructed access points which are generally provided at pedestals or towers that are located at spaced apart positions along the underground cables. Typically, the cable lengths are approximately 1 mile or longer with the access points being disposed about 500 feet apart for underground residential distribution (URD) or underground commercial distribution (UCD) circuits. At these various access points, there are provided cable circuit switches and faulted circuit indicators (FCI) which are located inside a transformer and switchgear box.

When a cable failure occurs, a fuse or circuit breaker or other circuit interrupting or protective device will be tripped so as to cause a circuit interruption. A linecrew will be sent to inspect the FCI in the transformer and switchgear box at each switch location to determine the last FCI unit (tripped) to indicate the passage of a fault current. In this manner, the faulted cable section can be located. With this information, the fault cable section can then be "switched out" or isolated so as to become a new open-loop point. Consequently, full restoration of service is provided during the time when the faulted cable section is being repaired. This procedure just described is commonly followed by virtually all of the electric utilities in the United States and involves about a 2 to 4 hour period of time to be accomplished.

This approach has several major disadvantages. For example, each of the transformer and switchgear boxes must be located, which may be covered or hidden by shrubs, bushes or other debris, and the locked doors thereof must be opened (which may be rusted) in order to check the status of the FCI units therein. This is a very time-consuming and laborious task. Further, prior to the fault locating step the cable is to be de-energized, tested for potential, and grounded so as to remove the charge due to the cable capacitance. Thus, this method requires additional time and labor expense which is a slow and tedious process.

After the steps of determining of an existence of a cable fault and determining the approximate location of such fault, linemen or repairmen later return in several days to find the exact and actual location of the fault so that the appropriate repairs can be made in order to restore the circuits to their previous normal operation.

The various procedures to be followed after the cable is de-energized and the different cable fault locating techniques are outlined in an article entitled "IEEE Guide for Fault Locating on Unshielded Power Cable Systems" and drafted by the Insulated Conductors Committee Draft 6 dated Dec. 17, 1993. The variety of techniques described in this article included time domain reflectrometry, arc reflection, surge pulse, capacitive discharge (thumper), and fault reduction (burning). However, all of these methods require the use of costly special equipment in order to determine the distance to the fault or otherwise pinpoint the fault location with reasonable accuracy. For example, there is a commercially available prior art reflection system using a memory radar which is manufactured by VON Corporation of Birmingham, Ala. This prior art system is typically quite heavy and is mounted on a special van or truck and must be operated by specially-trained crewmen on site after the testing has been performed on the de-energized cable. Such a system may cost as much as $10,000.00 and other similar commercialized equipment may run up to $100,000.00.

There is also known in the prior art of a digital fault locator which calculates the reactance of a faulty line, with a microprocessor, using the one-terminal voltage and current data of the transmission line. This digital fault locator has been described in an article entitled "Development of a New Type Fault Locator Using the One-Terminal Voltage and Current Data" by M. Yamaura et al., published in IEEE Transactions on Power Apparatus and Systems, Vol. PAS-101, No. 8, August 1982, pp. 2892–2898. This paper also stated generally that one of the methods for measuring the distance to a fault point on a transmission line is to set off pulses when a fault occurs and the pulse return time from the fault point is utilized to determine the location of the fault point. This same comment is mentioned in U.S. Pat. No. 4,313,169 to T. Takagi et al. issued on Jan. 26, 1982, at column 1, lines 18–26. However, the inventors of the present invention are unaware of any such fault locators in commercial use which rely upon this principle.

There also exists a number of prior art patents that have been granted which are directed to fault locators of the type for determining the location of high resistance ground faults by using impedance based calculations. In other words, the voltage and the current are measured at both ends of the faulted line and some algorithm would make the calculation of the distance to the fault based upon the measurements. However, none of the prior art fault locators considered the effect the arc voltage had on the calculations, which could be very high, in the case of overhead lines, thereby preventing the pinpointing of the fault location with a high degree of accuracy. The prior art patents are believed to be best exemplified by U.S. Pat. Nos. 3,474,333; 4,107,778; 4,314,199; 4,559,491; 4,785,249; 4,857,854; 4,868,507; 4,909,937; and 5,160,926.

For example, in U.S. Pat. No. 3,474,333 to H. Hoel issued on Oct. 21, 1969, there is disclosed an apparatus for determining the distance between a supervisory station in an A.C. system and a fault affecting the system. The apparatus includes means for measuring the voltage when the current traverses the zero datum and means for determining the derivative of the current at that instance. An output device determines from this information the inductive reactance under the fault condition to provide an indication of the distance to the fault.

In U.S. Pat. No. 4,107,778 to Y. Nii et al. issued on Aug. 15, 1978, there is disclosed a digital fault-location calculation system for a large electric power transmission system. There are provided voltage and current transformers 12 and 14 for measuring the respective voltage and current. A process unit 16 is coupled between the transformers and a computer 18 and includes a sampling-A/D converter. The digital computer includes a CPU 20, a memory device 22, and a control electronic circuit 24. The computer functions to detect the occurrence of the fault in the power transmission line and to calculate accurately the distance from an installation point of the transformers to the fault location point in accordance with predetermined processes.

In U.S. Pat. No. 4,559,491 to M. Saha issued on Dec. 17, 1985, there is taught a method for locating a fault point within a section of a three-phase power transmission line located between a network positioned behind the section and a network positioned ahead of the section. Currents and voltages are measured at a measuring point at one end of the section. The distance between the measuring point and the fault point is computed on the basis of the measured values and the parameters of the section.

U.S. Pat. No. 4,857,854 to T. Matsushima issued on Aug. 15, 1989, teaches a digital fault locator for locating a fault point of a power transmission system which includes a memory for storing electric amounts of an input from the power transmission system and a plurality of digital filters having different filter functions to which the electric amounts are supplied from the memory. Specific ones of the outputs of the digital filters are selectively used according to a persisted time of a fault to measure a distance to the fault point.

U.S. Pat. No. 4,868,507 to E. Reed issued on Sep. 19, 1989, shows a resistance fault locator circuit for determining the distance to a fault between two conductors of a cable. The fault locator circuit includes a digitally-controlled current split circuit 29, an error amplifier 9, a programmed computer 37, and relay switches for establishing several modes of operation of the circuit.

U.S. Pat. No. 4,906,937 to K. Wikstrom et al. issued on Mar. 6, 1990, shows a method and device for determining the location of a fault on a power transmission line between two stations. The phase voltage and the phase current or changes in the phase current are measured on the occurrence of a fault. These measured values are low pass filtered and then converted from an analog to an instantaneous digitized current and voltage values. The fault distance and an apparent fault resistance at the fault location are calculated and then compared with the respective upper and lower limits. A tripping signal is generated by a logic unit when the fault position and the apparent fault resistance are within the limit values, respectively.

Aside from these prior art patents, there are also known heretofore the use of microprocessor-based relays by electric utilities for protecting transmission systems against overcurrents and for locating faults. Further, the use of microprocessor technology relative to protective relay systems is described in an article by Stanley E. Zocholl entitled "Integrated Metering and Protective Relay Systems," published in IEEE Transaction Industry Applications, Vol. 25, No. 5, Sept./Oct. 1989, pp. 889–893.

There still exists another prior art system which utilizes a single-ended impedance-based monitoring of the fault parameters to calculate the distance to a fault with the aid of a microprocessor. A report of this work is described in the paper entitled "An Advanced Technology To Automate The Location of URD Cable Faults," written by E. E. Baker, Paul Pearson, Jr., A. P. Sakis Meliopoulis, and A. C. Westrom and was presented to the Edison Electric Institute T & D Committee on Apr. 7, 1993. This prior art system assumed a fixed arc-voltage in the single-ended impedance-based calculation. It was found from an analysis of the test data collected made on a variety of actual cable faults that the system had an unacceptable degree of accuracy in pinpointing the fault location. This was caused by very large and continuously variable arc voltages experienced at the fault location which could range from a few hundred volts to 3500 volts on a 7.2 KV circuit. It was determined that variability of the arc voltage will typically exist within each half-cycle of arcing. Based on the studies conducted, it was concluded that the single-ended impedance-based system was not practical for cable fault determination due to the inability to monitor the effect of the arc voltage at a location remote from the fault point.

In view of the electric utilities increasingly employing more underground installations in recent years, there has been a corresponding increase in the number of cable faults. As a result of this trend in technology, there has been a continued need for an improved fault-locating apparatus which can determine the location as quickly as possible after the inception of a fault and which can pinpoint the location of such fault with a high degree of accuracy.

The present invention represents a significant improvement over all of the aforementioned prior art. Based upon recent test data, the present invention has the capability of determining the fault location within five feet or less of the faulted cable location. This is accomplished in the present invention by the use of a pulse generator for injecting a series of chirped pulse streams into the cable shortly after the occurrence of the cable fault. The delay times between the pulses sent on the faulted cable and the reflected pulse signals are used to calculate the distance to the cable fault.

SUMMARY OF THE INVENTION

Accordingly, it is a general object of the present invention to provide an improved fault distance locator for underground cable circuits which is relatively simple and economical to manufacture and assemble, but yet overcomes the disadvantages of the prior art fault-location systems.

It is an object of the present invention to provide a fault distance locator for underground cable circuits and a method for the same for calculating more accurately the location of a cable fault from a source-connected monitoring location in an efficient and effective manner.

It is another object of the present invention to provide a fault distance locator for underground cable circuits for pinpointing the location of the fault with a high degree of accuracy, without being affected by the arc voltage appearing at the cable fault.

In accordance with these aims and objectives, there is provided in a preferred embodiment of the present invention a fault distance locator for an underground cable for calculating accurately the location of a cable fault. The fault distance locator includes means for monitoring the cable current to produce a fault-current occurrence signal upon the occurrence of a cable fault and means for monitoring the cable voltage to produce a fault-voltage occurrence signal upon the occurrence of the cable fault. A pulse generator is provided for injecting periodically a chirped pulse stream into the cable prior to the occurrence of the cable fault in order to obtain a reference pulse signal.

A controller device is responsive to the fault-current occurrence signal and the fault-voltage occurrence signal for initializing the pulse generator to send a series of chirped pulse streams into the faulted cable at a high sampling rate for a predetermined amount of time subsequent to the fault and prior to a fault interruption in order to obtain reflected pulse signals. The controller device includes correlation means for correlating the reflected pulse signals to the reference pulse signal to determine delay times between the pulse signals sent on the faulted cable and the reflected pulse signals therefrom so as to calculate the distance to the location of the cable fault.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
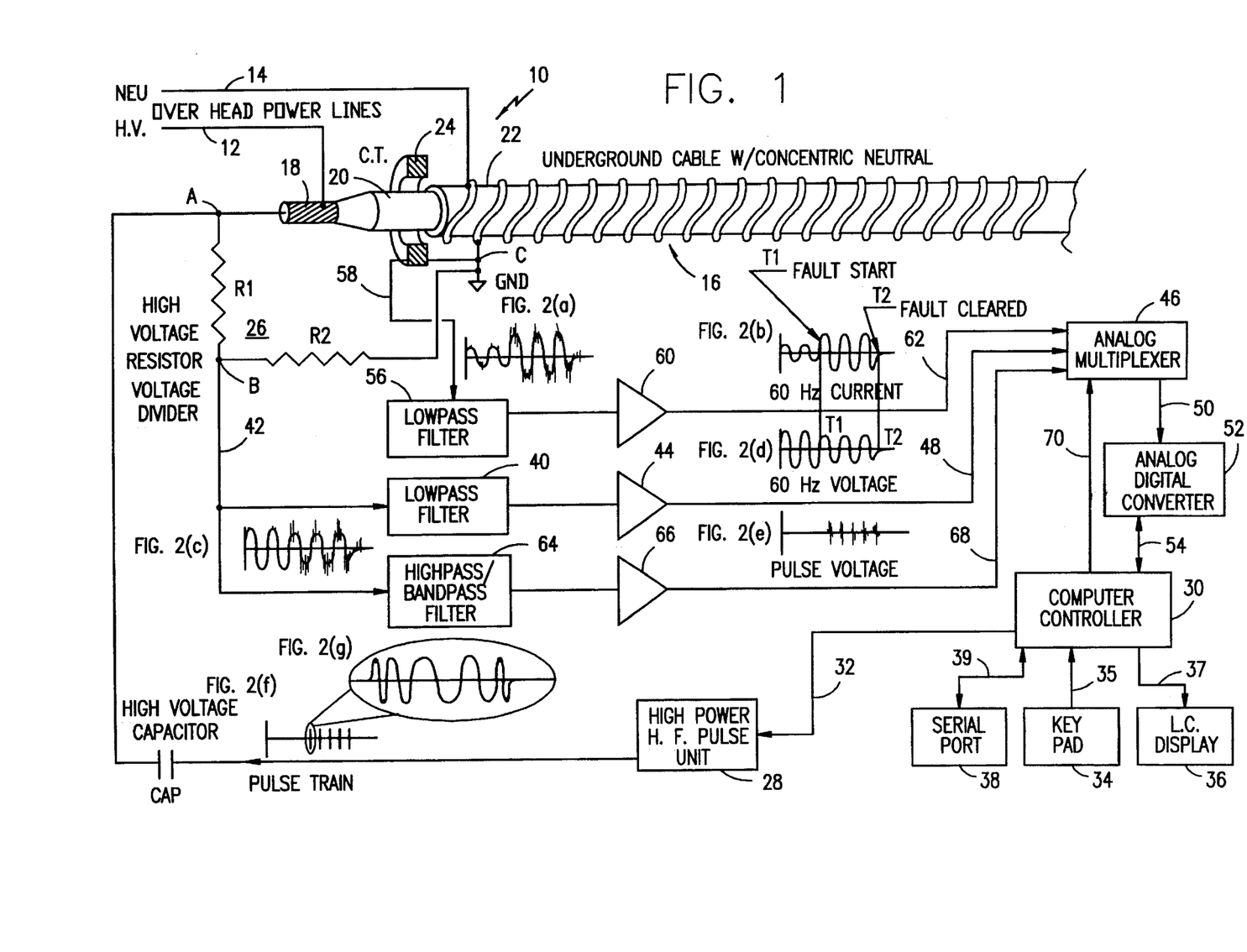
FIG. 1 is a block diagram of a fault distance locator, constructed in accordance with the principles of the present invention.

Referring now to FIG. 1 of the drawings, there is shown a block diagram of a fault distance locator 10 for underground cable circuits and a method for the same for calculating accurately the location of a cable fault, constructed in accordance with the principles of the present invention. The fault distance locator 10 of the present invention has the capability of pinpointing with a relatively high degree of accuracy the location of the cable fault (i.e., within a few feet) in a short amount of time after the inception or occurrence of the fault. The fault distance locator can be installed generally on an underground residential distribution (URD) terminal pole which connects the cable circuit to an overhead power source or may be located alternatively on a switching cubicle.

The overhead power lines from a source (not shown) are comprised of a high voltage wire or cable 12 and a neutral wire 14. An underground cable or transmission line designated generally by reference numeral 16 is formed of a center conductor 18 surrounded by an intermediate polymeric insulation layer 20 and a concentric neutral 22 disposed over the polymeric insulation layer 20. The center conductor 18 is suitably connected to the high voltage wire 12, and the concentric neutral 22 is suitably connected to the neutral wire 14.

The current of the underground cable 16 involved is detected or monitored by a current transformer 24 (C.T.) disposed coaxially with the cable. The voltage of the underground cable is detected or monitored by a voltage divider 26 formed by a first high voltage resistor R1 and a second high voltage resistor R2. One end of the resistor R1 is joined to the center conductor 18 at node A, and the other end of the resistor R1 is joined to one end of the resistor R2 at node B. The other end of the resistor R2 is joined to the concentric neutral 22, which is tied also to a system reference ground GND at node C.

A high power, high frequency pulse generator unit 28 is used to provide a pulse stream of high frequency pulses onto the underground cable 16 via a high voltage capacitor CAP. Typically, the pulse stream will be in the form of a chirped pulse stream of six to seven symmetrical pulses with a frequency between 0.5 to 5 MHz. Preferably, the pulses will have an average period of approximately 400 nanoseconds (2.5 MHz). The pulse generator unit 28 is formed with a low output impedance so that it can be considered as an equivalent voltage source. The pulses are injected by the pulse generator unit into the conductor 18 of the underground cable 16 shortly after a cable fault has been determined to exist, as will be explained more fully hereinafter. The pulse generator unit 28 is controlled by a computer controller 30 via line 32.

Alternatively, instead of the chirped pulse stream the pulses may be in the form of a pulse stream having a single frequency or two frequencies. Further, the pulse stream of the single frequency can be made to have a changing amplitude. In addition, the shape of the pulses may not only be square but can also be sinusoidal or triangular in form. As used herein, the term "pulse stream" is thus defined broadly to refer either to a series of individual pulses with a variety of shapes and/or amplitudes or a single pulse waveform having a particular shape and/or varying amplitude.

The computer controller preferably includes a microprocessor, a read-only memory (ROM) for storing a program executed by the microprocessor, and a random-access memory (RAM) for storing variables used in data processing and computations. The microprocessor may be one which is commercially available, similar to Motorola MC6809.

A keypad 34 is provided to allow a system operator to enter data into the microprocessor and to make changes to the stored program. The keypad 34 is connected to the computer controller 30 via line 35. A liquid crystal (L.C.) display 36 is provided for displaying information from the controller 30 to the system operator via line 37. A serial port 38 coupled to the controller via line 39 is a serial communication port, such as RS-232-C, which may be connected to a remote computer terminal unit, a CRT and/or a modem so as to report information directly to a source/monitoring location in order to observe the L.C. display 36.

During non-fault operation, the voltage of the cable from the voltage divider at node B will be sent to a low-pass filter 40 via line 42 so as to remove high order harmonics of the voltage and to obtain only the fundamental component and lower order harmonics. This filtered voltage signal is then passed through an amplifier 44 to a first input of an analog multiplexer 46 via line 48. The output of the multiplexer on line 50 is fed to the input of an analog-to-digital (A/D) converter 52 for converting the analog voltage signal to a digitized voltage signal. This digitized voltage signal on the line 54 is then delivered to the microprocessor in the computer controller 30 for processing and then stored in predetermined addresses in the random-access memory.

Similarly, the cable current as monitored by the current transformer 24 is sent to a low-pass filter 56 via line 58 so as to remove the high order harmonics of the current and to obtain only the fundamental component and lower order harmonics. This filtered current signal is then passed through an amplifier 60 to a second input of the multiplexer 46 via line 62. The analog current signal is also converted to a digitized current signal by the A/D converter 52 and then processed by the computer controller 30.

In the no-fault condition, the computer controller 30 is programmed to send out pulses periodically at predetermined intervals, such as every 15 to 30 minutes. These pre-fault pulses are also passed through the voltage divider 26 and exist at the node B. Thereafter, the pulse signal is sent to a high-pass or bandpass filter 64 so as to eliminate the 60 Hz and its harmonics as well as any low frequency noise. This filtered pulse signal is passed through an amplifier 66 to a third input of the multiplexer 46 via line 68. Again, the analog pulse signal is also converted to a digitized pulse signal via the A/D converter 52 and processed by the controller 30. The most current of the pulse signals will be stored in the random-access memory to be used and defining a reference pulse signal for calculating distance when a fault occurs.

This pre-fault pulse injection at the predetermined intervals is used to enhance the accuracy of the fault distance calculation. This is because the pulse data will furnish the most recent value of the actual pre-fault surge impedance of the cable, which is changeable from cable environment. The major characteristic of the cable which is changed due to the cable environment will be the dielectric coefficient of the insulation layer 20 since it is greatly temperature dependent. This, in turn, will affect the surge impedance. As is known, the surge impedance will affect the speed of propagation and thus the delay time.

As can be seen, the three inputs on the lines 48, 62 and 68 corresponding to the respective voltage, current and pulse signals are applied to the multiplexer 46. The multiplexer is switched periodically so that these various input signals to be monitored can be sampled at a predetermined time interval (i.e., 5 to 50 MHz sampling rate). It should be noted that this sampling rate is controlled by the computer controller 30 via line 70.

When a fault does occur, the computer controller 30 will initiate the injection into the cable a series of chirped pulse streams or bursts every few hundred microseconds until the cable is cleared. In other words, the pulse streams will be delivered continuously until a fuse, circuit breaker, or circuit interrupting device is activated or opened causing a circuit interruption. The time delay between the sending pulses and their associated reflected pulse signals are monitored for approximately 100 to 200 microseconds after each burst and the corresponding data is stored in the random-access memory of the controller for processing after the fault has been cleared. The pulse data taken during the arcing fault is correlated with the reference pulse in order to determine the delay time to the primary reflection. The times for the return reflected pulses are used in conjunction with the propagation velocity of the cable for calculating the distance to the fault.

Figure 2A:
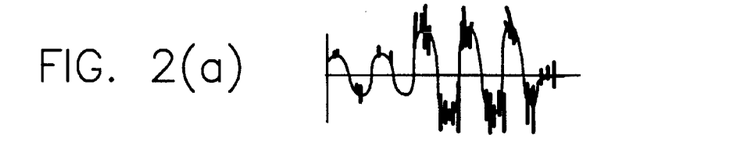
FIGS. 2(a)–2(g) are waveforms at various points in the blocks of FIG. 1, useful in understanding the operation of the present invention.
Figure 2B:
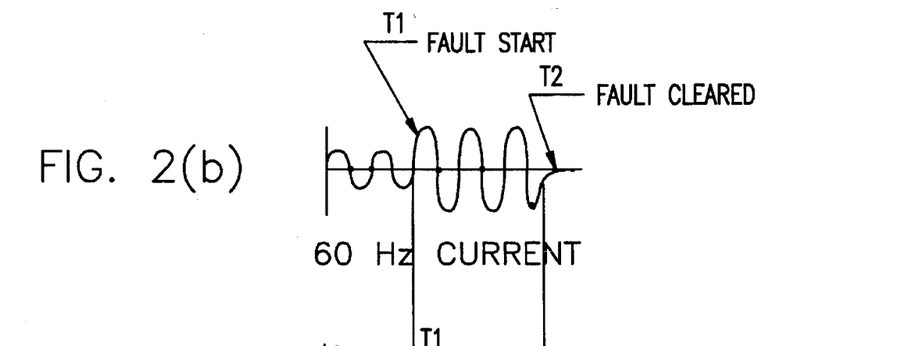

With particular reference to FIG. 2(a) through 2(g) of the drawings, the general overall monitoring procedure performed by the computer controller 30 will now be described. The voltage and current on the cable are continuously monitored every few milliseconds or several times a cycle for 60 Hz by the controller 30 to determine if a fault has occurred. The first output voltage on the line 58 from the current transformer 24 is proportional to the current in the high voltage phase wire or conductor 18. This first output voltage is a 60 Hz waveform which contains noise and possibly the current from the injected pulse, as illustrated in FIG. 2(a). However, the current from the injected pulse will be noted to be small relative to the 60 Hz waveform. This is because the surge impedance of the cable is larger than the characteristic impedance at 60 Hz. The filtered current signal from the low-pass filter 56 and the amplifier 60 is illustrated in FIG. 2(b) and contains only the fundamental component (60 Hz) and its lower order harmonics.

Figure 2C:
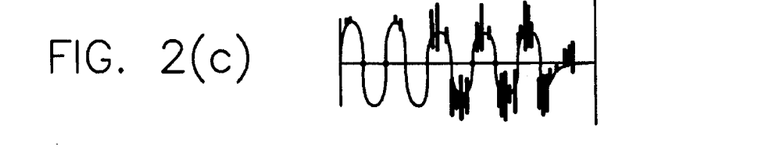
Figure 2D:
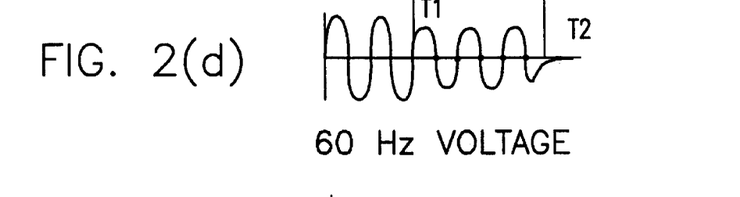
Figure 2E:
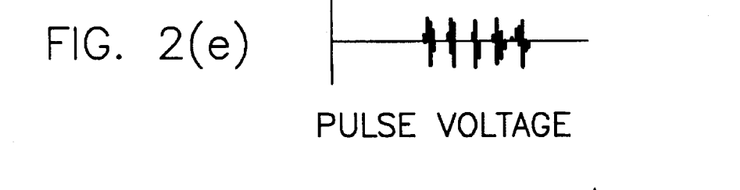

The second output voltage on the line 42 from the voltage divider 26 is proportional to the voltage in the high voltage phase wire or conductor 18. This second output voltage is depicted in FIG. 2(c). This second output voltage is also low-pass filtered so as to pass only the fundamental component (60 Hz) and the lower order harmonics. This filtered voltage signal from the low-pass filter 40 and the amplifier 44 is depicted in FIG. 2(d). This second output voltage is further high-pass and/or bandpass filtered so as to pass only the high frequency pulses injected onto the cable defining a pulse voltage. This filtered pulse voltage from the high-pass or bandpass filter 64 and the amplifier 66 is shown in FIG. 2(e).

Figure 2F:
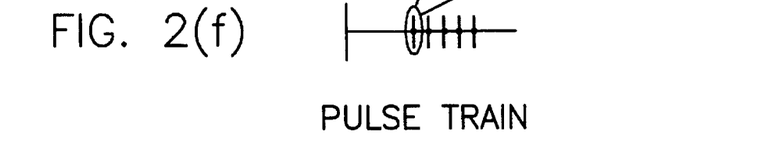
Figure 2G:
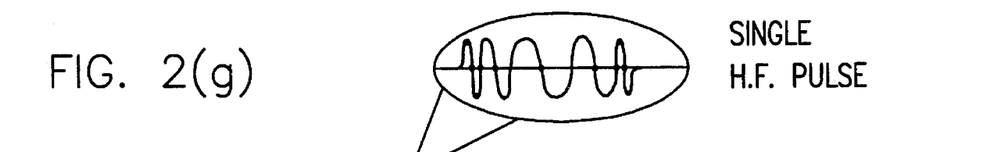

At predetermined intervals, such as every 15 to 30 minutes, as previously explained, the controller 30 will inject periodically the high frequency pulse in FIGS. 2(f) and 2(g) onto the cable under the no-fault condition and will measure the pulse voltage for a period of 100 to 200 usec. A set of 4,000 to 5,000 data points will be sampled and stored in the random-access memory, and the controller will calculate the time to the reflection from the end of the cable. By utilizing this reflection time and the known length of the cable, the controller can determine the velocity of propagation $V_p$ in the cable. This propagation speed will also be stored and subsequently used in calculating the distance to the fault. Further, a few microseconds of the most recent pre-fault data set of the actual pulse voltage will be stored as a reference pulse data and will be employed in the correlation process of FIG. 3 to determine the time to reflection off the arc at the location of the fault.

When a large increase in current occurs, such as at time T1 in FIG. 2(b), indicative of a fault, the controller will detect this occurrence and will send out a series of pulses (FIGS. 2(f) and 2(g)) in rapid succession. It will be noted that a corresponding decrease in the voltage will occur as well as shown at time T1 in FIG. 2(d). Then, a set of 4,000 to 5,000 data points will be sampled for each pulse and stored in the random-access memory. These pulses are injected onto the cable every few hundred microseconds or less until either the fault is cleared at time T2 in FIG. 2(b) or the memory is filled. It is generally this latter event that occurs first. With the present memory capacity, there are between 10–20 data sets stored. After collecting as many data sets as possible, the controller will calculate the distance to the fault for each data set in accordance with the correlation process of FIG. 3. This calculated distance obtained from each data set will be averaged so as to produce improved accuracy. Finally, this averaged distance will be displayed on the L.C. display 36 for use by the repairmen in locating the exact location of the fault with a high degree of accuracy.

Figure 3:
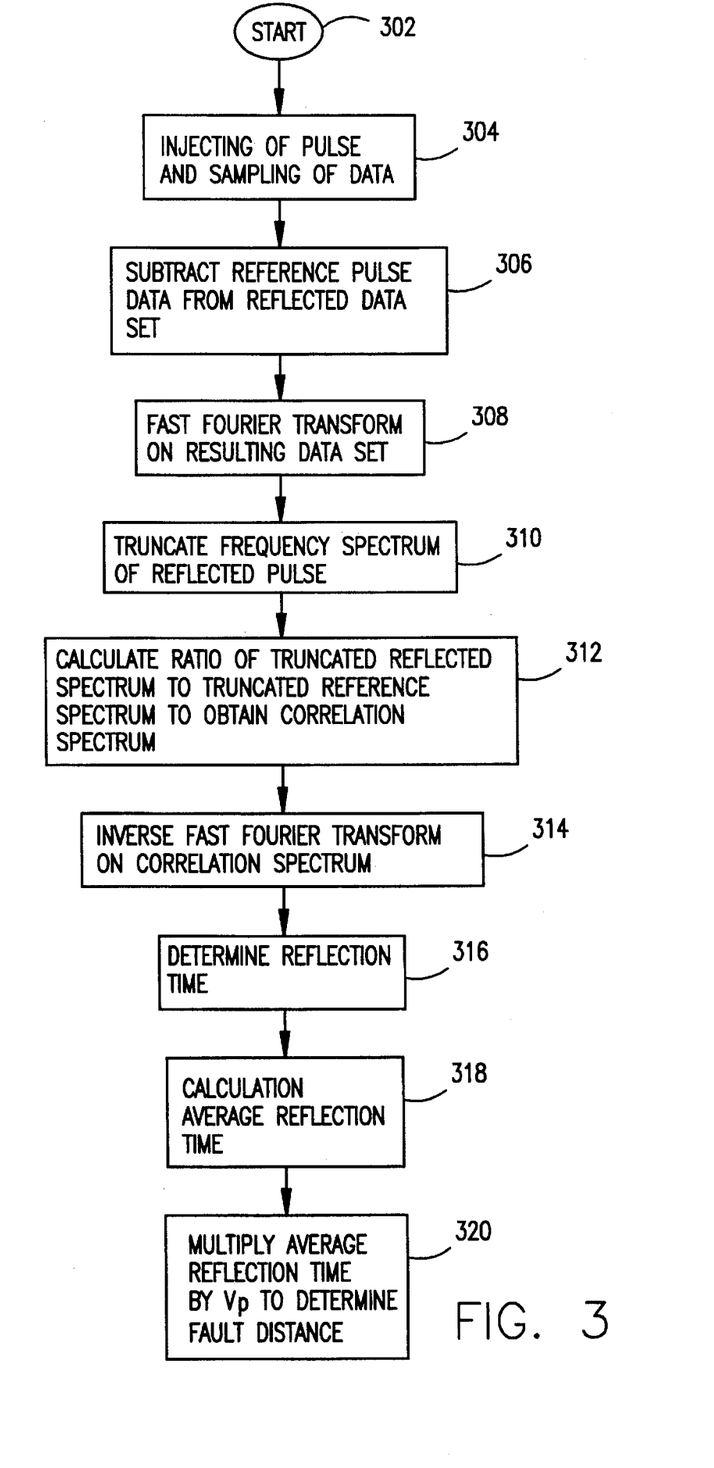
FIG. 3 is a flow chart of the operation performed by the controller in the fault distance locator of FIG. 1.
Figure 4A:
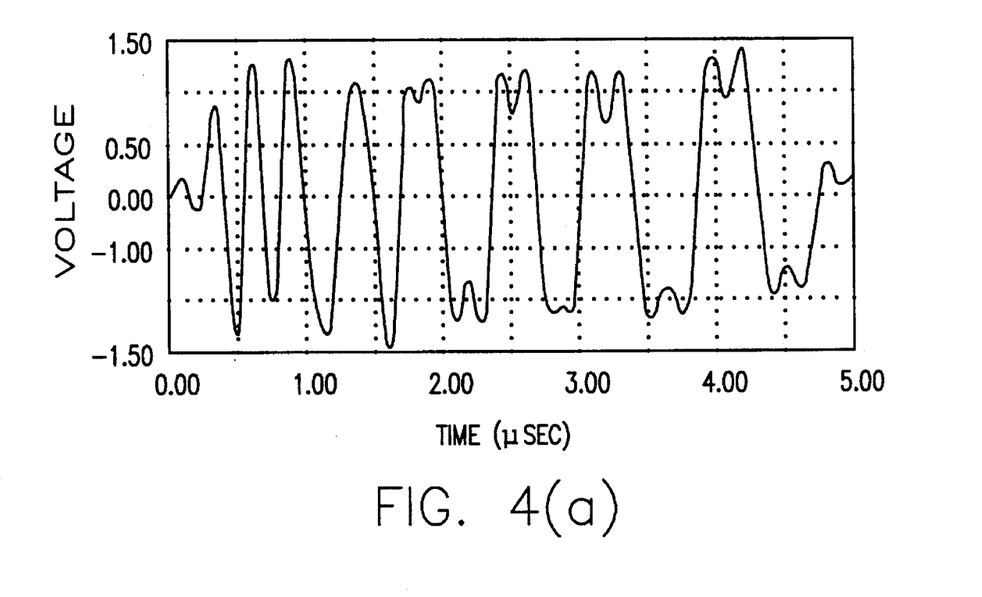
FIGS. 4(a) through 4(i) are waveforms useful in understanding and explaining the operation of the flow chart of FIG. 3.
Figure 4B:
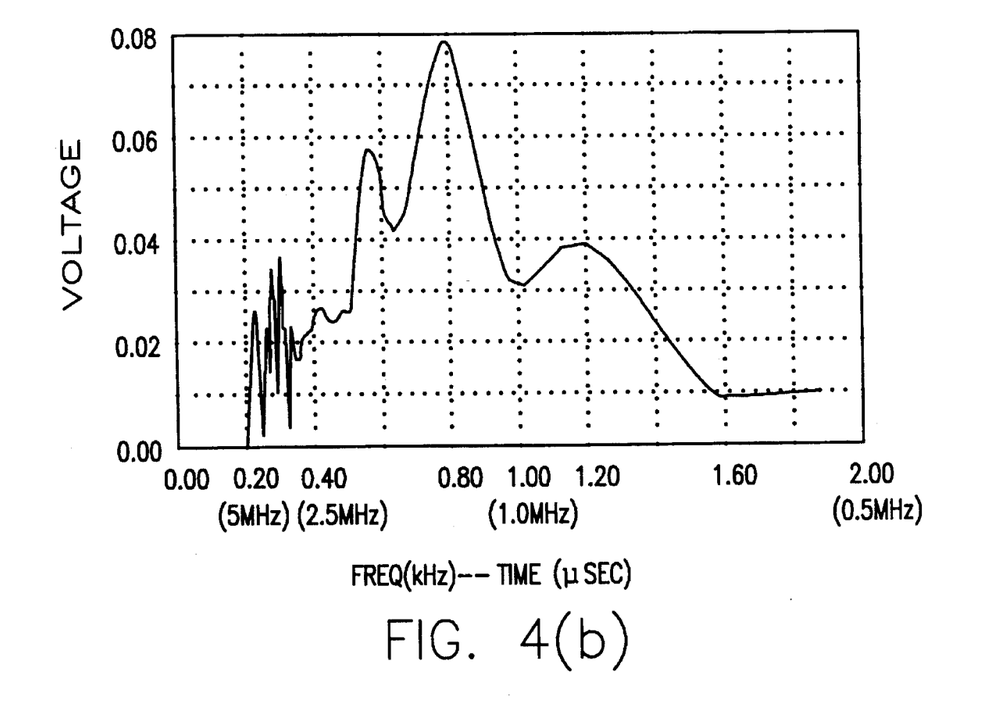

The correlation process used by the controller 30 is shown in the flow chart of FIG. 3 for calculating the fault distance for each sampled data set and will be explained in connection with the waveforms of FIGS. 4(a)–4(g). Initially, there is illustrated in FIG. 4(a) a waveform of the chirped square wave pulse which is being sent defining the reference pulse signal. This chirped pulse has energy over a frequency band rather than at only a single frequency. This distribution of energy permits a more accurate detection of the reflection time. A frequency spectrum of this sending or reference pulse is illustrated in FIG. 4(b). It will be noted that most of the energy is concentrated in the frequency band between 5 MHz to 0.6 MHz which corresponds to the times of 0.2 uS to 1.6 uS.

The correlation process is started in block 302 upon the detection of a fault. In the block 304, the pulse generator 28

(FIG. 2) is initialized or triggered by the controller 30 so as to begin simultaneously the pulse injection and the sampling of data on the pulse voltage. It is preferable to take approximately 4,000 to 5,000 samples at the sampling rate of 20 MHz so as to produce a cumulative sampling time of between 200 to 250 uS. This will allow sufficient time for a reflection to return from a discontinuity on a cable length of 50,000 feet.

Figure 4C:
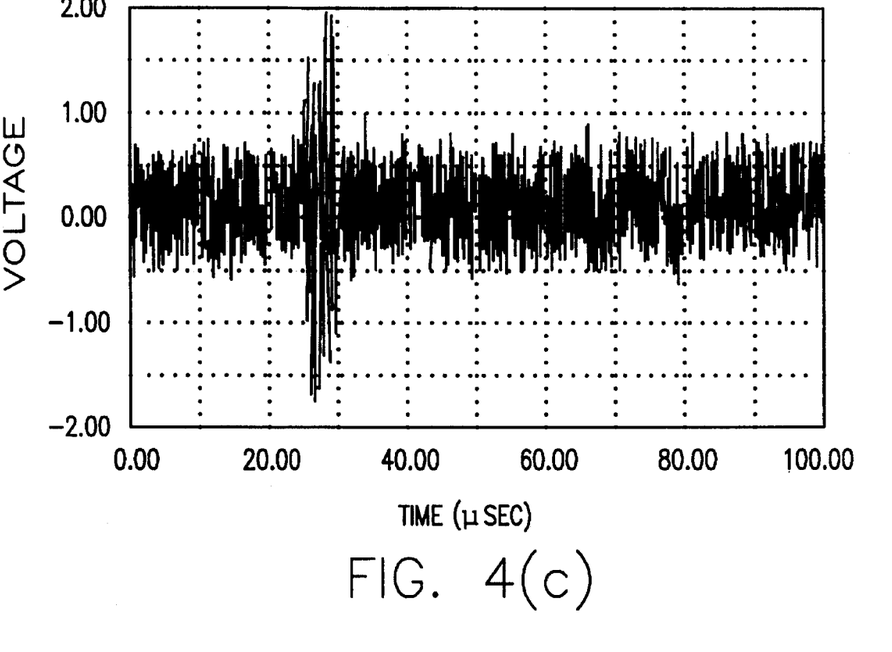
Figure 4D:
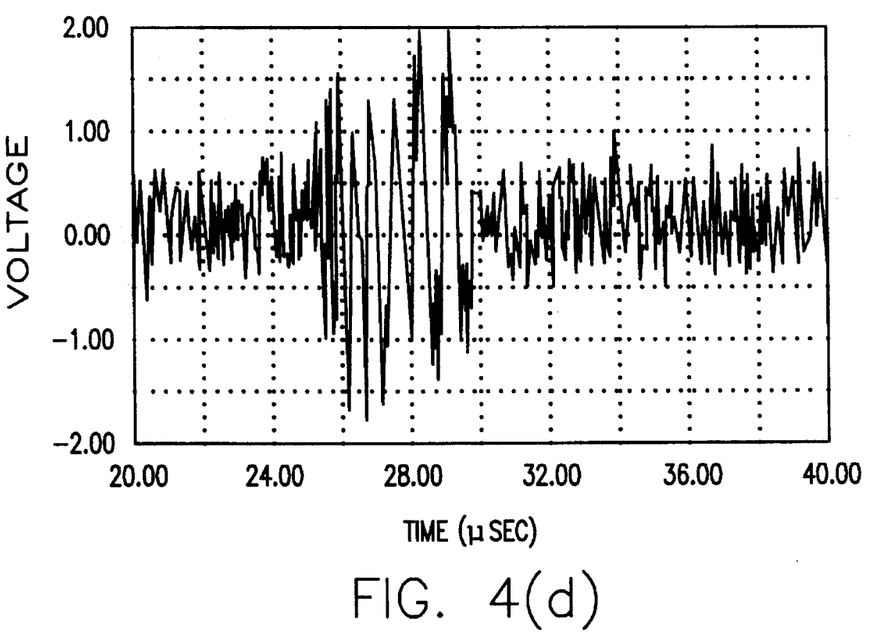

It will be understood by those skilled in the art that the acquisition of data must be started at the beginning of the pulse injection to obtain measurements on a close fault. Since the pulse duration may be longer than 3 to 10 mS, it may mask a short reflection (a close fault) that occurs in less than the pulse length. Accordingly, the reference pulse data of the most recent pre-fault reference pulse must be subtracted in block 306 from the reflected data set in order to remove the actual pulse from the data set. This resulting data set is shown in FIG. 4(c) and contains a single reflected pulse with a substantial amount of noise. In FIG. 4(d), there is shown a time expansion of the waveform of FIG. 4(c) which better illustrates the same.

Figure 4E:
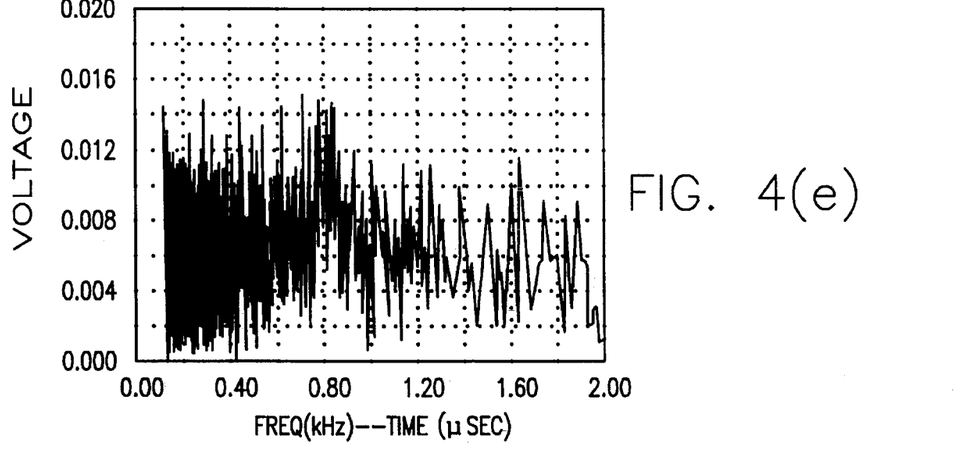

In order to locate the frequency spectrum of this resulting data set of FIGS. 4(c) and 4(d), a known Fast Fourier Transform technique is used in block 308 which allows for analyzing the property of the resulting data set based upon energy. Accordingly, the frequency spectrum of the reflected pulse and the associated noise of FIG. 4(d) is depicted in FIG. 4(e). It can be seen that the main energy region of interest for the reflected pulse is barely discernible and is masked by the noise spikes. In order to eliminate the effect of this noise in the regions where most of the pulse energy does not exist, the frequency spectrum is truncated in block 310 by setting these points to a zero value. This is done for both the reference and reflected pulse data.

Figure 4F:
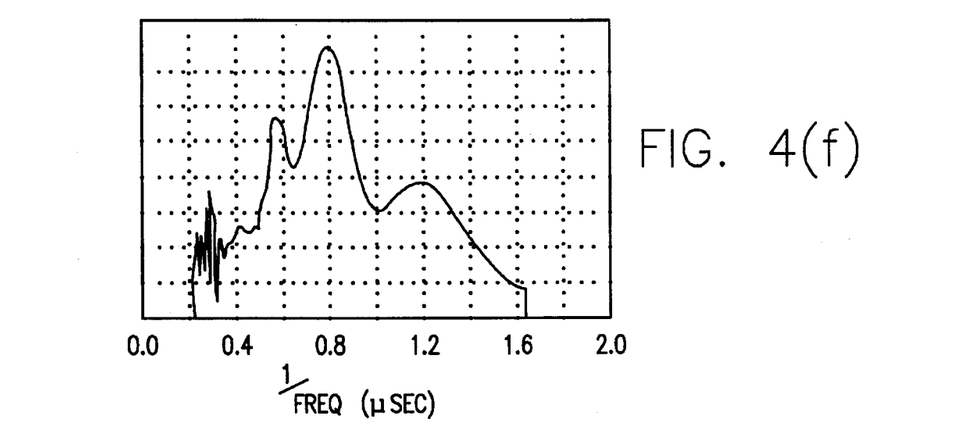
Figure 4G:
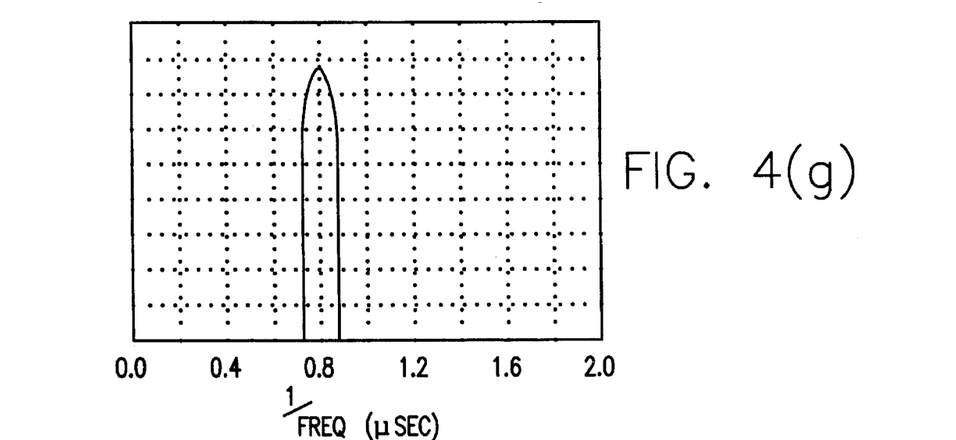

There are shown in FIGS. 4(f) and 4(g) the truncated frequency spectrum of the reference pulse for two different bands of the reference spectrum of FIG. 4(b). The frequency band in FIG. 4(f) is between 0.617 MHz and 4.651 MHz. The frequency band in FIG. 4(g) is between 1.136 MHz and 1.389 MHz. The reflected pulse spectrum of FIG. 4(e) is also truncated in this manner.

Figure 4H:
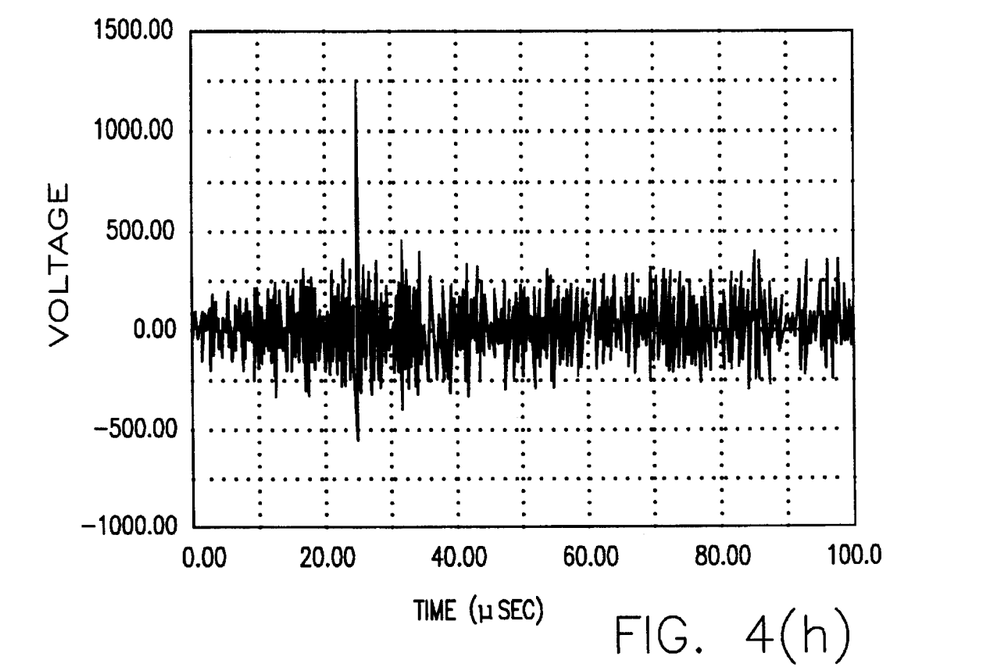
Figure 4I:
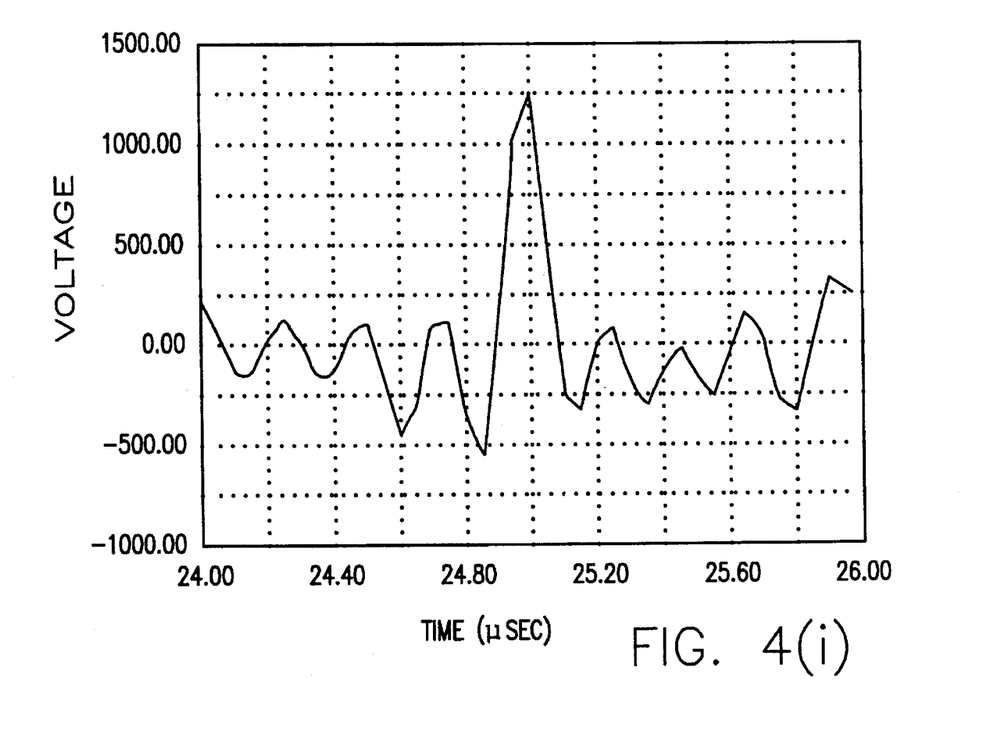

In block 312, the ratio of the reflected pulse data set truncated from the spectrum of FIG. 4(e) with respect to the reference pulse data in the truncated spectrum of FIGS. 4(f) and 4(g) is obtained on a point-by-point basis in order to define a correlation spectrum. An inverse Fast Fourier Transform is performed on the correlation spectrum in block 314 so as to convert the same back to the time domain for a frequency band between 0.617 MHz and 4.651 MHz. This is depicted in FIG. 4(h). A time expansion of the waveform of FIG. 4(h) is shown in FIG. 4(i). As can best be seen from FIG. 4(i), a distinct peak occurs at the time 25 uS, which is the reflection time from the arc occurring at the fault location. This reflection time is determined in the block 316.

These process steps in blocks 304–316 are repeated for each injected pulse and the corresponding reflected pulse in order to determine a new reflection time. In block 318 all of the times to reflection calculated from the data sets are averaged to produce the most accurate value of the reflection time. This averaged reflection time is multiplied in the block 320 by the propagation speed $V_p$ which was previously calculated and stored in the memory, in order to obtain the distance to the location of the fault.

From the foregoing detailed description, it can thus be seen that the present invention provides an improved fault distance locator for underground cable circuits for calculating accurately the location of a cable fault. The fault distance locator includes a pulse generator unit for injecting a series of chirped pulse streams into the faulted cable shortly after the cable fault is established. The delay times between the reflected pulse signals and the sending pulse signals are obtained by a correlation process which is specifically designed to eliminate the effect of noise caused by arcing voltage and thus provides a basis to calculate accurately the cable fault distance.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A distance fault locator for an underground cable for calculating accurately the location of a cable fault, said fault distance locator comprising:

means for monitoring the cable current to produce a fault-current occurrence signal upon the occurrence of a cable arcing fault;

means for monitoring the cable voltage to produce a fault-voltage occurrence signal upon the occurrence of the cable arcing fault;

means for injecting periodically a pulse stream into the cable prior to an initial occurrence of the cable arcing fault in order to obtain a reference pulse signal;

controller means responsive to said fault-current signal and said fault-voltage signal for triggering said injection means to send a series of pulse streams into the faulted cable at a high sampling rate for a predetermined time interval occurring subsequent to the initial occurrence of the cable arcing fault at a first time and prior to a cable interruption at a second time in order to obtain reflected pulse signals during the cable arcing fault; and said controller means including correlation means for correlating said reflected pulse signals to said reference pulse signal to determine delay times between the pulse signals sent on the faulted cable during the predetermined time interval of the cable arcing fault and the reflected pulse signals therefrom so as to calculate the distance to the location of the cable fault.

2. A fault distance locator as claimed in claim 1, further comprising means for low pass filtering said fault-current occurrence signal to generate an analog filtered current signal.

3. A fault distance locator as claimed in claim 2, further comprising means for low pass filtering said fault-voltage occurrence signal to generate an analog filtered voltage signal.

4. A fault distance locator as claimed in claim 3, further comprising means for high pass and/or bandpass filtering said reference pulse signal, said sending pulse signals, and said reflected pulse signals to generate respective analog filtered reference pulse signal, analog filtered sending pulse signal, and analog filtered reflected pulse signal.

5. A fault distance locator as claimed in claim 4, further comprising means for converting said analog filtered reference signal, said analog filtered sending pulse signals, and analog filtered reflected pulse signals into corresponding digitized signals.

6. A fault distance locator as claimed in claim 5, wherein said controller means includes memory means for storing data representative of said digitized signals.

7. A fault distance locator as claimed in claim 1, wherein said injection means is comprised of a pulse generator unit which generates the reference pulse signal at a frequency range between 0.5 to 5 MHz.

8. A fault distance locator as claimed in claim 7, wherein the sampling rate is at a frequency between 5 to 50 MHz for a period of 50 to 500 microseconds.

9. A fault distance locator as claimed in claim 8, further comprising a high voltage capacitor interconnected between said pulse generator unit and said cable.

10. A fault distance locator as claimed in claim 9, further comprising a voltage divider interconnected between said underground cable and said low pass filtering means for producing said fault-voltage occurrence signal.

11. A fault distance locator as claimed in claim 1, wherein said correlation means includes means for converting by a fast Fourier transform each of sending/reflected pulse signals and said reference pulse signals into a frequency domain representation.

12. A fault distance locator as claimed in claim 11, wherein said correlation means further includes means for determining the ratio of each of said sending/reflected pulse signals with said reference pulse signals only in a preselected frequency range in order to eliminate the effect of noise caused by arcing voltage.

13. A fault distance locator as claimed in claim 12, wherein said correlation means further includes means for converting by an inverse fast Fourier transform said frequency spectrum back into a time domain to produce a major spike signal indicative of the delay time between the sending pulse signal and the reflected pulse signal which is used to determine the distance to the cable fault.

14. A fault distance locator as claimed in claim 2, wherein said means for low pass filtering comprises a low pass filter which removes the high harmonic and provides only a fundamental component of the fault-current occurrence signal.

15. A fault distance locator as claimed in claim 3, wherein said means for low pass filtering is comprised of a low pass filter which removes the high frequency and provides only a fundamental component of the fault-voltage occurrence signal.

16. A method for calculating the location of a cable fault in an underground cable, comprising the steps of:

monitoring the cable current to produce a fault-current occurrence signal upon the occurrence of a cable arcing fault;

monitoring the cable voltage to produce a fault-voltage occurrence signal upon the occurrence of the cable arcing fault;

injecting periodically a pulse stream into the cable prior to an initial occurrence of the cable arcing fault in order to obtain a reference pulse signal;

initializing a series of pulse streams to be sent in response to said fault-current signal and said fault-voltage signal into the faulted cable at a high sampling rate for a predetermined time interval occurring subsequent to the initial occurrence of the cable arcing fault at a first time and prior to a cable interruption at a second time in order to obtain reflected pulse signals during the cable arcing fault; and correlating said reflected pulse signals to said reference pulse signal to determine delay times between the pulse signals sent on the faulted cable during the predetermined time interval of the cable arcing fault and the reflected pulse signals therefrom so as to calculate the distance to the location of the cable fault.

17. A method for calculating the location of a cable fault as claimed in claim 16, wherein said correlation step includes the step of converting by a fast Fourier transform each of sending/reflected pulse signals and said reference pulse signals into a frequency domain.

18. A method for calculating the location of a cable fault as claimed in claim 17, wherein said correlation step further includes the step of determining the ratio of each of said sending/reflected pulse signals with said reference pulse signals only in a preselected frequency range in order to eliminate the effect of noise caused by arcing voltage.

19. A method for calculating the location of a cable fault as claimed in claim 18, wherein said correlation step further includes the step of converting by an inverse fast Fourier transform said frequency spectrum back into a time domain to produce a major spike signal indicative of the delay time between the sending pulse signal and the reflected pulse signal which is used to determine the distance to the cable fault.

20. A method for calculating the location of a cable fault in claim 19, further comprising the steps of locating the center peak of the spike and calculating a weighted average of the delay time for each set of sending/reflected pulse signals in order to facilitate a more precise calculation of the distance to the cable fault.

* * * * *